United States Patent
Dobkin et al.

(10) Patent No.: US 8,754,622 B2
(45) Date of Patent: Jun. 17, 2014

(54) VOLTAGE REGULATOR COMPENSATING FOR VOLTAGE DROP ALONG CONDUCTORS BETWEEN REGULATOR OUTPUT AND LOAD

(75) Inventors: Robert Dobkin, Monte Sereno, CA (US); Thomas P. Hack, Steamboat Springs, CO (US); Yuhui Chen, Fremont, CA (US)

(73) Assignee: Linear Technology Corporation, Milpitas, CA (US)

( * ) Notice: Subject to any disclaimer, the term of this patent is extended or adjusted under 35 U.S.C. 154(b) by 1133 days.

(21) Appl. No.: 12/610,190

(22) Filed: Oct. 30, 2009

(65) Prior Publication Data
US 2011/0101937 A1    May 5, 2011

(51) Int. Cl.
| | | |
|---|---|---|
| G05F 1/56 | (2006.01) | |
| G05F 1/563 | (2006.01) | |
| G05F 1/565 | (2006.01) | |
| G05F 1/575 | (2006.01) | |

(52) U.S. Cl.
USPC ............................. 323/282; 323/285; 323/290

(58) Field of Classification Search
USPC ......... 323/275, 277, 282, 283, 284, 285, 290, 323/301, 302
See application file for complete search history.

(56) References Cited

U.S. PATENT DOCUMENTS

| | | | | |
|---|---|---|---|---|
| 5,751,139 | A * | 5/1998 | Jordan et al. | 323/222 |
| 5,929,620 | A * | 7/1999 | Dobkin et al. | 323/288 |
| 6,894,461 | B1 * | 5/2005 | Hack et al. | 323/205 |
| 7,170,195 | B2 * | 1/2007 | Haensel et al. | 307/43 |
| 7,348,767 | B2 * | 3/2008 | Hack et al. | 323/316 |
| 7,358,532 | B2 * | 4/2008 | Nakagawa | 257/59 |
| 7,518,351 | B2 * | 4/2009 | Liao et al. | 323/284 |
| 7,714,547 | B2 * | 5/2010 | Fogg et al. | 323/224 |
| 2005/0243894 | A1 * | 11/2005 | Chen et al. | 375/139 |
| 2007/0236201 | A1 * | 10/2007 | Brown | 323/284 |
| 2010/0253307 | A1 * | 10/2010 | Chen et al. | 323/283 |

* cited by examiner

*Primary Examiner* — Adolf Berhane
*Assistant Examiner* — Nusrat Quddus
(74) *Attorney, Agent, or Firm* — Patent Law Group LLP; Brian D Ogonowsky

(57) ABSTRACT

An automatic voltage compensation circuit in a voltage regulator compensates the output voltage for a voltage drop along lines leading to a remote load. A load capacitor is connected across the load for providing a low impedance across the load during a test phase of the regulator. In one embodiment, during the test phase, the load current is changed up or down a small percentage (e.g., 10%). As a result, the regulator voltage changes due only to the line resistance since the load is bypassed by the load capacitor. The voltage drop at full load current is then derived by detecting the change in regulator output voltage (a fractional voltage drop) and multiplying it. The normal mode is resumed, and the derived voltage drop is added to the regulator output by either compensating the feedback loop or by adding the voltage drop to the output of the regulator.

34 Claims, 9 Drawing Sheets

VOLTAGE REGULATOR COMPENSATING FOR VOLTAGE DROP ALONG CONDUCTORS BETWEEN REGULATOR OUTPUT AND LOAD

FIELD OF THE INVENTION

This invention relates to voltage regulators and, in particular, to a technique for automatically compensating an output voltage of a regulator for voltage drops along long lines connecting the regulator to the load.

BACKGROUND

FIG. 1 illustrates a prior art system where a voltage regulator 10 supplies a regulated voltage (Vout) at a certain current ($I_{LOAD}$) to a remote load 12 ($R_{LOAD}$) via two wires 14 and 15. The regulator 10 detects its output voltage near an output terminal of the regulator 10 and uses the sensed voltage as a feedback signal to maintain the output voltage at a specified level.

In applications where the lines (e.g., wires or other conductors) between the regulator 10 and load 12 are long, each line has a significant resistance ($R_{LINE}$), which causes a voltage drop. Therefore, the voltage at the load is lowered by the voltage drop along the two lines. In the example of FIG. 1, although the regulator 10 is outputting a regulated voltage of Vout, the voltage across the load $R_{LOAD}$ is Vout−($I_{LOAD}*2R_{LINE}$). If the wires 14/15 were 20 gauge, the resistance would be about 0.01 ohms/foot. If the load current $I_{LOAD}$ was 10 amps, and the two wires were each 10 feet, the voltage across the load 12 would be 2 volts less than the regulated output voltage.

To compensate for such voltage drops, it is known to provide remote sensing of the load voltage by connecting voltage sense lines to the load that conduct only a small current and thus have a low voltage drop. The remotely sensed voltage is then used as the feedback voltage for the regulator to maintain the voltage at the load at a specified voltage. Providing such long voltage sense cables adds expense and complexity to the circuit. Other drawbacks exist.

There are also regulator compensation circuits that are configured to output a specified voltage at the remote load, where the line resistance is known and compensated for in the regulator output voltage. The regulator then continually compensates for an increased or decreased voltage drop as the regulator supplies more or less current to the load during its normal operation. However, such circuits require prior knowledge of the lines' resistance and do not detect the actual voltage drop in the lines. Accordingly, such circuits also do not compensate for changes due to temperature or connector instabilities. Therefore, such circuits have limited utility and do not provide an accurate regulated voltage to the load.

What is needed is an improved technique for remote sensing of the voltage at a remote load that automatically compensates for actual voltage drops along lines of any length and resistance. The inventive technique described herein is referred to as virtual remote sensing.

SUMMARY

Various embodiments of a circuit are described for automatically compensating a voltage regulator output for the voltage drop along the lines using virtual remote sensing.

Generally, the circuit modulates the regulator output current or output voltage a fraction of the full load current or target output voltage and detects the change in voltage or current, respectively. This fractional change is related to the line resistance. The fractional change is then scaled up to derive the actual line voltage drop at full load current. This compensation value is then used to increase the regulator output voltage to compensate it for the line voltage drop. The AC change in the regulator's output does not affect the load since a load capacitor is connected across the load.

In an embodiment where the output current is varied during the test or interrogation phase, the circuit periodically or continually performs a test algorithm that measures a fraction of the actual voltage drop along the lines between the regulator and the load. The detected fractional voltage drop is then multiplied to derive the actual voltage drop when the regulator is supplying the load current. The derived voltage drop is then effectively added to the output of the regulator. In one embodiment, the voltage drop is simply added to the regulator's output. In another embodiment, the regulator's feedback signal or reference voltage is modified by the derived voltage drop to cause the regulator to increase its original-target output voltage by the voltage drop.

In one embodiment, the fractional voltage drop is created by rapidly raising or lowering the regulator's normal load current by, for example, 10%, then sampling and holding the resulting detected voltage at the output of the regulator. The detected voltage during this test phase is subtracted from the normal output voltage to identify a fractional voltage drop in the lines due to the fractional change in current during the test phase. The detected fractional voltage drop during this test phase is only affected by the line resistance, and not affected by the load resistance, because a load capacitor is connected across the load to provide a very low AC impedance to the current step during the test phase. The load capacitor also effectively prevents the load from being affected by the AC test or interrogation signal. The voltage difference (fractional voltage drop) between the normal output voltage and the detected voltage during the test period is then scaled by a factor (e.g., by 10) to recreate the full voltage drop. The derived full voltage drop is then used to compensate the output of the regulator as previously described.

In one embodiment, to offset the temporary raising or lowering of the output current during the test phase, the current is oppositely raised or lowered sometime during the test period so the average load current does not change. The small current changes produce an insignificant ripple in the load voltage due to the capacitors filtering the current changes.

In another embodiment, the regulator is controlled to continually step its output current between two levels, and the current into the load is the average. A load capacitor presents a low impedance to the AC signal. The detected fractional voltage change due to the different current levels and the line resistance is then used to calculate the full voltage drop across the lines at the average current, and the regulator voltage output is compensated for the voltage drop.

In another embodiment, instead of the current being varied to detect a fractional voltage change, the regulator output voltage is forced to change by a known amount, and the fractional current change due to the voltage change and line resistance is detected. This information is used to calculate the full voltage drop at the load current. The regulator output is then compensated for the full voltage drop so as to provide the desired regulated voltage at the load. Such a circuit may intermittently run the test (or interrogation) phase or the test may be continually performed by outputting a varying voltage that ramps between two levels.

The test phase, where the regulation is overridden to change the output, may be performed at any interval. In one embodiment, the regulator switches at a frequency greater than 100 kHz, and the test period is performed at a frequency of about 4000 Hz. In another embodiment, the test is performed at a 50% duty cycle. In another embodiment, the frequency of the test phase may be continuously changed to avoid harmonics, beat frequencies, etc.

The minimum load capacitor value needed to substantially bypass the load resistance during the current or voltage change depends on the frequency of the current or voltage change.

A soft-start circuit may be employed to delay the output voltage compensation until a steady state condition exists after start up.

The regulator can be a switching regulator, a linear regulator, or any other type of regulator.

The invention may be an add-on circuit used with any conventional regulator or can be part of the regulator itself. For example, the invention may be a separate chip that receives signal levels and provides a compensated feedback signal into a regulator chip pin (e.g., the Vc pin). The invention can also be part of a regulator controller chip. The invention may also be created using discrete components.

BRIEF DESCRIPTION OF THE DRAWINGS

Elements that are the same or equivalent are labeled with the same numeral.

DETAILED DESCRIPTION

Figure 1:
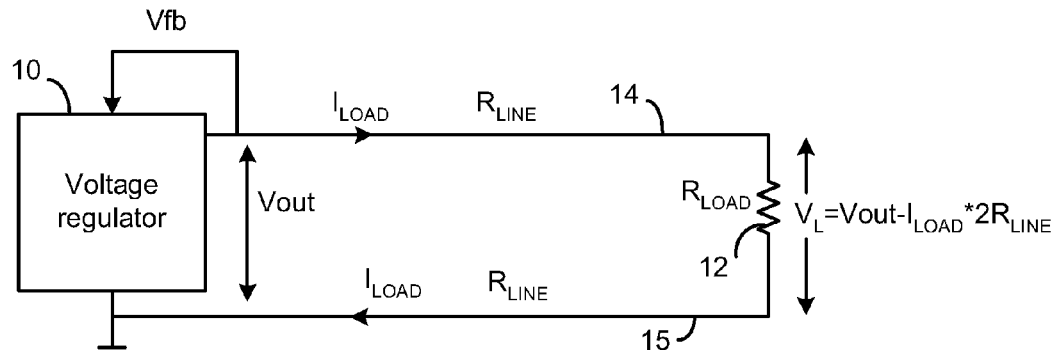
FIG. 1 illustrates a prior art regulator and load circuit with long lines that incur a voltage drop.
Figure 2:
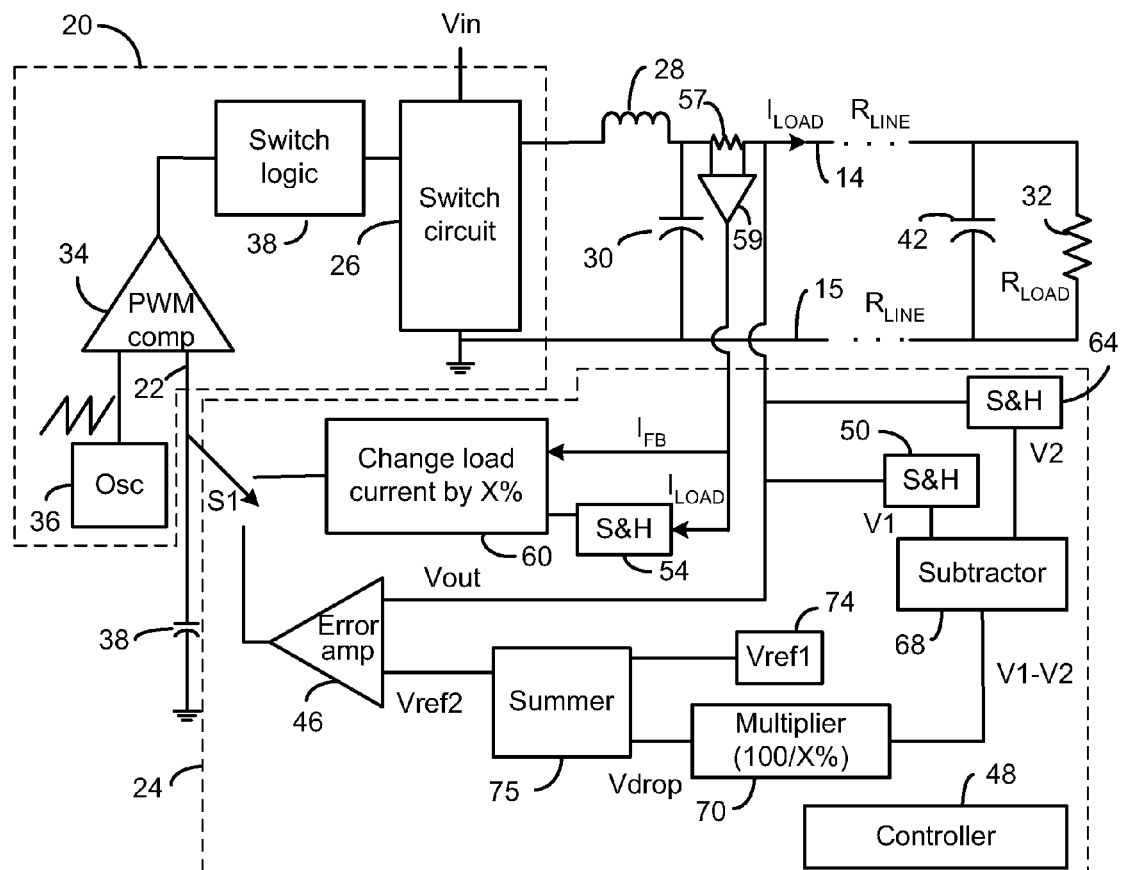
FIG. 2 is a simplified schematic diagram of one embodiment of the invention that compensates the feedback loop of a conventional regulator to add the lines' voltage drop to the output of the regulator.

FIG. 2 illustrates one embodiment of the invention. The invention can be in the form of a chip that is used in conjunction with any conventional voltage regulator. One type of conventional voltage regulator chip 20 is identified within a dashed outline. Conventional voltage regulators in an IC package typically have a pin 22 that is connected to the output of an internal error amplifier and have another pin that receives a feedback voltage representative of the output voltage of the regulator. In the example of FIG. 2, the internal voltage feedback loop provided by the conventional regulator chip 20 is bypassed by the components in the inventive circuit 24, shown in dashed outline. The regulator chip 20 and inventive circuit 24 will typically be mounted on the same printed circuit board. The circuit 24 may be formed as a single IC.

The conventional regulator chip 20 is represented in FIG. 2 as a simple voltage-mode switching regulator, although any type of regulator may be used. A simple voltage-mode regulator comprises one or more transistor switches, as part of a switch circuit 26, that switch at an operating frequency of typically greater than 100 kHz. During a charging phase, a switch couples Vin to one end of the inductor 28, which charges the inductor 28 and creates a ramping current through the inductor 28. This ramping current is filtered by an output capacitor 30. The capacitor 30 smoothes the ripple to provide a substantially DC voltage to the load 32, represented as a resistive load 32 for simplicity.

During a discharge phase, the charging transistor switch is shut off and the end of the inductor 28 is connected to ground by either a switch (a synchronous rectifier) or a diode. The inductor 28 is then discharged, creating a downward current ramp through the inductor 28, which is smoothed by the capacitor 30.

The duty cycle of the charging time vs. switching period determines the average load current and the output voltage. The duty cycle is controlled by a control voltage coupled to pin 22 (e.g., a Vc pin). A pulse width modulator (PWM) comparator 34 compares the control voltage to a sawtooth waveform output by an oscillator 36. At the beginning of each cycle, the inductor 28 starts charging and, when the oscillator sawtooth ramp crosses the control voltage, the PWM comparator 34 toggles, causing the discharge phase to begin. The switch logic block 38 represents drivers and circuitry to prevent both switches conducting simultaneously.

The set up and operation of the inventive circuit 24 will be described with reference to the flowchart of FIG. 3 and the waveform of FIG. 4.

Figure 3:
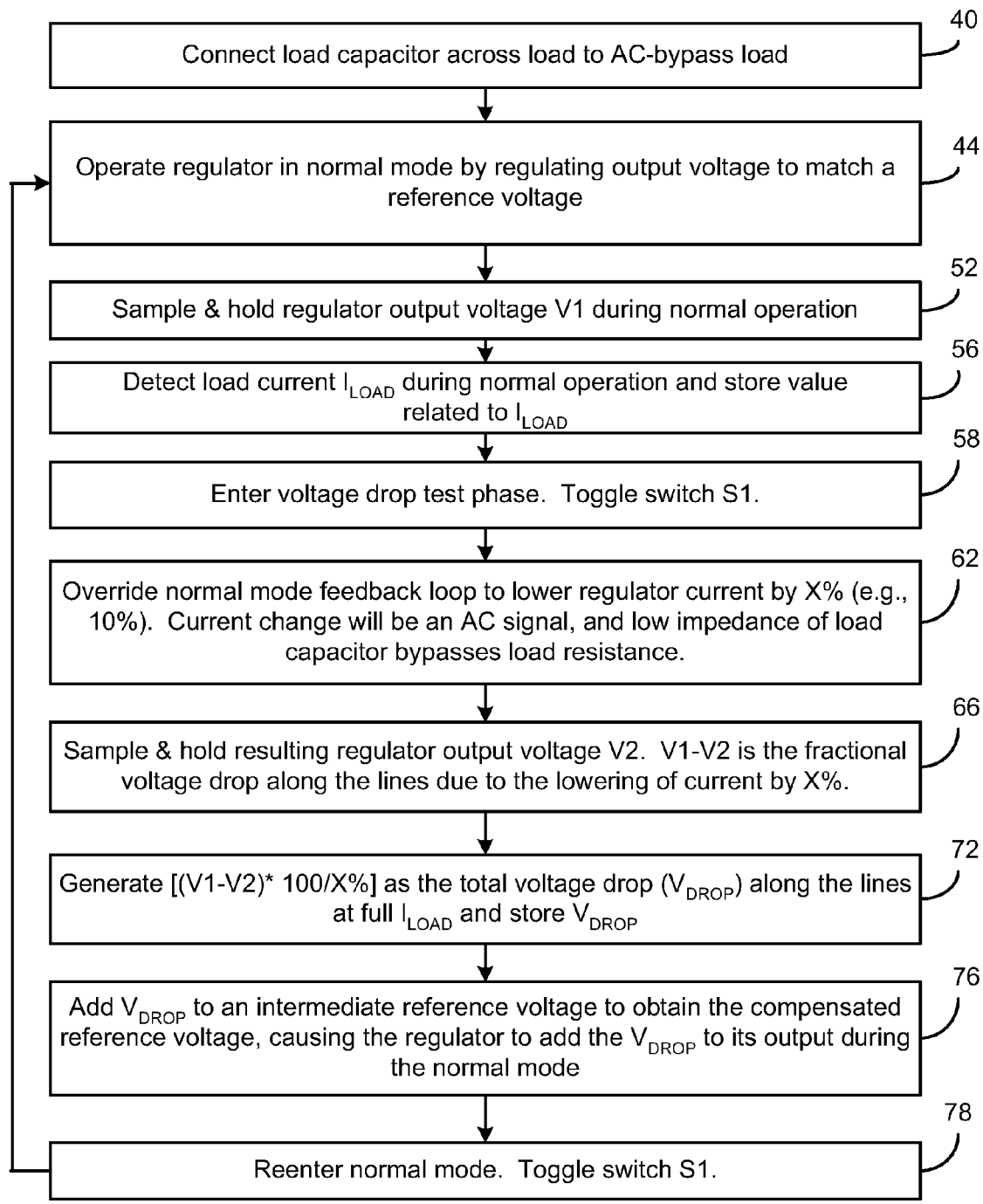
FIG. 3 is a flowchart of the operation of the circuit of FIG. 2.

In step 40 of FIG. 3, a load capacitor 42 is connected across the load 32, close to the load 32, to AC-bypass the load 32. The value of the capacitor 42 is specified to be above a certain minimum value so that, during a test phase of the regulator, when the regulator chip 20 is controlled to temporarily change its output current (an AC current change), the load capacitor 42 presents a very low impedance to bypass the load resistance. Therefore, the resistance seen by the regulator during the AC current change will be essentially only due to the resistance of the lines 14 and 15. The capacitor 42 also filters out the load voltage variation during the test phase. In one embodiment, the capacitor 42 presents an impedance during the AC current change that is less than 10% of the resistance of the lines 14 and 15. Any capacitance in the load itself also reduces the impedance during the test phase and, if the load is sufficiently capacitive, a separate load capacitor 42 is not needed.

In step 44, the regulator is operated in its normal mode (it is constantly regulating the output voltage based on the instantaneous output voltage). During the normal mode, switch S1 connects the output of the error amplifier 46 (typically a transconductance amplifier) to pin 22 of the regulator chip 20 (pin 22 is typically identified as the Vc pin in a data sheet). If the Vc pin is used, the regulator chip's internal error amplifier and other feedback path circuitry that is in a typical prior art regulator controller chip are bypassed by the circuit 24.

A capacitor 38 is connected to pin 22, where the positive and negative current output of the error amplifier 46 (depending on the relative values of the error amplifier's inputs Vout and Vref2) control the voltage across the capacitor 38. The magnitude of the capacitor 38 voltage controls the duty cycle of the regulator chip 20. The feedback loop (described in detail below) causes the duty cycle to be such that the Vout input into the error amplifier 46 substantially matches Vref2. During the normal mode of operation, the regulator chip 20 is supplying a regulated voltage to the load 32 at a current $I_{LOAD}$ drawn by the load.

Periodically, under the control of a controller 48 (e.g., a state machine), a test phase is entered into that samples the voltage drop of the lines 14 and 15 and compensates the control voltage at pin 22 to take into account the actual voltage drop of the lines 14 and 15 so that the voltage across the load 32 is a predetermined desired voltage. The test phase may be conducted at any frequency and is usually much lower than the switching frequency. In one embodiment, the test phase is conducted at a frequency of 4000 Hz.

Prior to entering the test phase, the controller 48 controls a sample & hold circuit 50 to store the regulated voltage V1 (step 52 in FIG. 3). A signal proportional to the actual load current $I_{LOAD}$ is also generated and stored by the sample & hold circuit 54 (step 56). Such a signal proportional to the load current $I_{LOAD}$ may be generated by sensing a voltage across a low value sense resistor 57 in series with the line 14 using a differential amplifier 59.

The test phase is then entered by the controller 48 toggling switch 51 (step 58) to connect pin 22 to the output of a circuit 60 that generates a control voltage whose level changes the output current of the regulator by X %. In the example, the circuit 60 generates a control voltage that causes the regulator output current to be 10% lower than the load current during the normal mode (step 62). The circuit 60 uses feedback to control the regulator current $I_{FB}$ to drop 10% lower than the normal load current $I_{LOAD}$. The percentage drop in current can be any percentage, such as between 1%-20%, depending on tolerable ripple in the load voltage. Once the regulator lowered the current by the predetermined amount, the regulator continues to output this current until the normal mode is resumed. The regulator is not outputting a regulated voltage at this time, but is outputting a voltage offset from the regulated voltage. In all the embodiments, it will typically take several switching cycles to reach the target output.

Once the regulator output is stable, the controller 48 controls the sample & hold circuit 64 to store the value of the output voltage V2 during this reduced current period (step 66). FIG. 4 illustrates the holding of the voltages V1 and V2 at times relative to the normal operation and during the test phase when the regulator current is forced down 10%. The actual current waveform may show a less abrupt current change due to the various filtering in the feedback loop.

A subtractor 68 (a unity gain differential amplifier) generates a level equal to V1−V2, which represents the fractional voltage drop along the lines 14 and 15 due to a 10% change in load current.

A multiplier 70 multiplies (scales) the value of V1−V2 by 100/X % (i.e., 10 in the example of a 10% current drop) to generate a voltage drop value equal to the actual voltage drop along the lines 14 and 15 at the full load current $I_{LOAD}$. The multiplier 70 then stores this voltage drop value (step 72). The multiplier 70 may be a multiplying sample & hold circuit that includes a fixed gain amplifier performing the scaling.

A non-compensated reference voltage Vref1 is generated by a reference voltage generator 74. If the regulator output voltage equaled Vref1, that output voltage value would be the desired voltage across the load 32. However, the output voltage must be compensated (increased) to offset the voltage drop along the lines 14 and 15. In other words, the Vref1 value assumes there is no voltage drop along the lines 14 and 15.

The voltage drop value Vdrop (generated by the multiplier 70) and Vref1 are applied to a summer 75 that generates a compensated reference voltage Vref2 (step 76). The compensated reference voltage Vref2 and the output voltage Vout of the regulator are applied to the inputs of the error amplifier 46.

In order for the average current to the load 32 to not be affected by the lowering of current in the test phase, the regulator is controlled to temporarily raise the output current above the normal load current an opposite amount at the end of the test phase, via circuit 60.

The test phase is then terminated, and the controller 48 toggles switch S1 to connect pin 22 of the regulator chip 20 to the output of the error amplifier 46 (step 78). The feedback loop causes the duty cycle of the regulator chip 20 to be such that the output voltage Vout substantially equals Vref2. (A scaled (e.g., divided) Vout voltage may also be the feedback voltage compared to Vref2.) The Vref2 compensates for the full voltage drop along the lines 14 and 15. The DC voltage across the load 32 will therefore be a predetermined desired voltage fully compensated for the actual voltage drop along the lines 14 and 15.

The test phase can be performed at any time and frequency. If the load current frequently changes, the voltage drop will frequently change, and it is desirable to perform the test phase periodically to compensate for the changing voltage drops.

Since the actual output voltages of the regulator may be relatively high, and it would be desirable to only handle small voltages in the circuit 24, the output voltage may be divided down to a low voltage in the feedback loop using a resistor divider and the reference voltages proportionally reduced.

Figure 5:
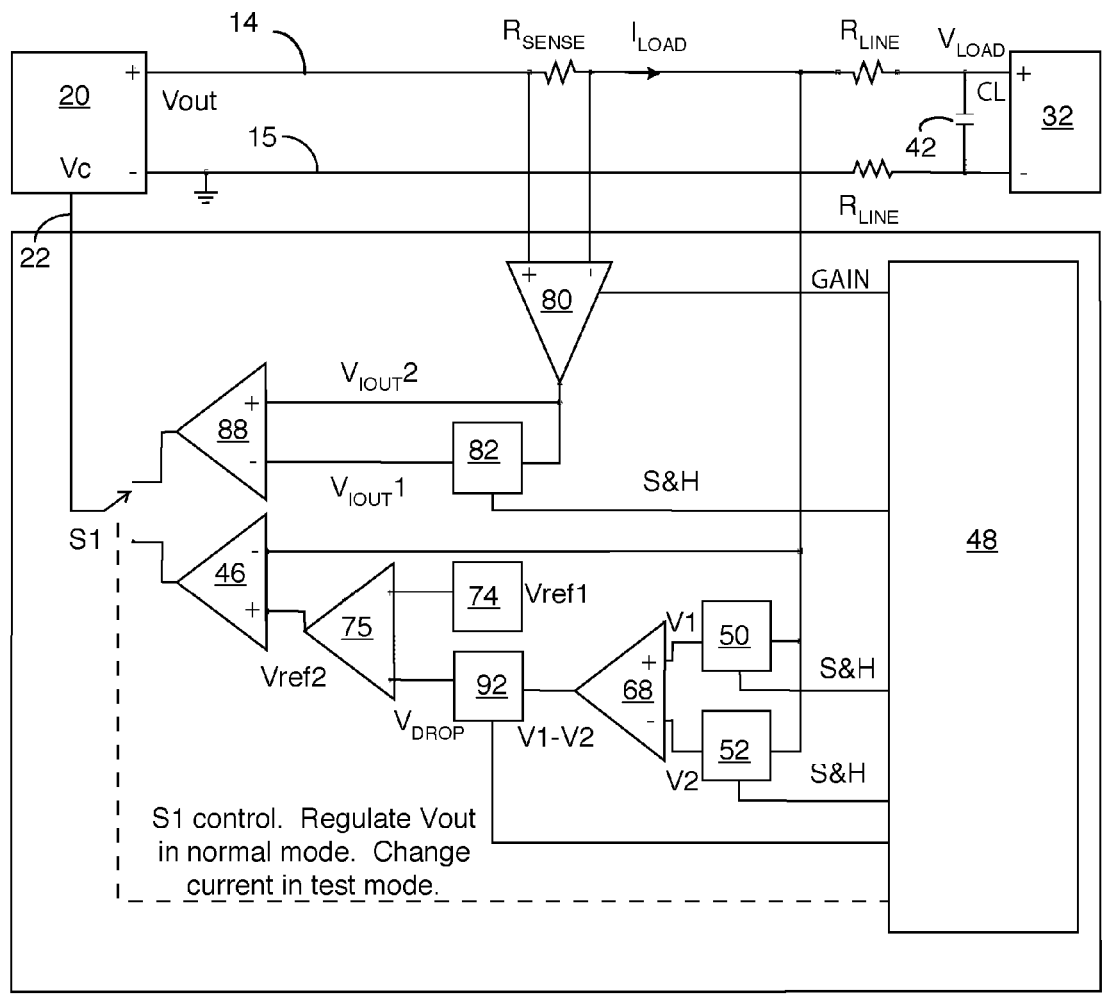
FIG. 5 is a more detailed schematic diagram of a circuit that also carries out the process of FIG. 3 but alternates between only two output levels in order to perform the virtual remote sensing.
Figure 6:
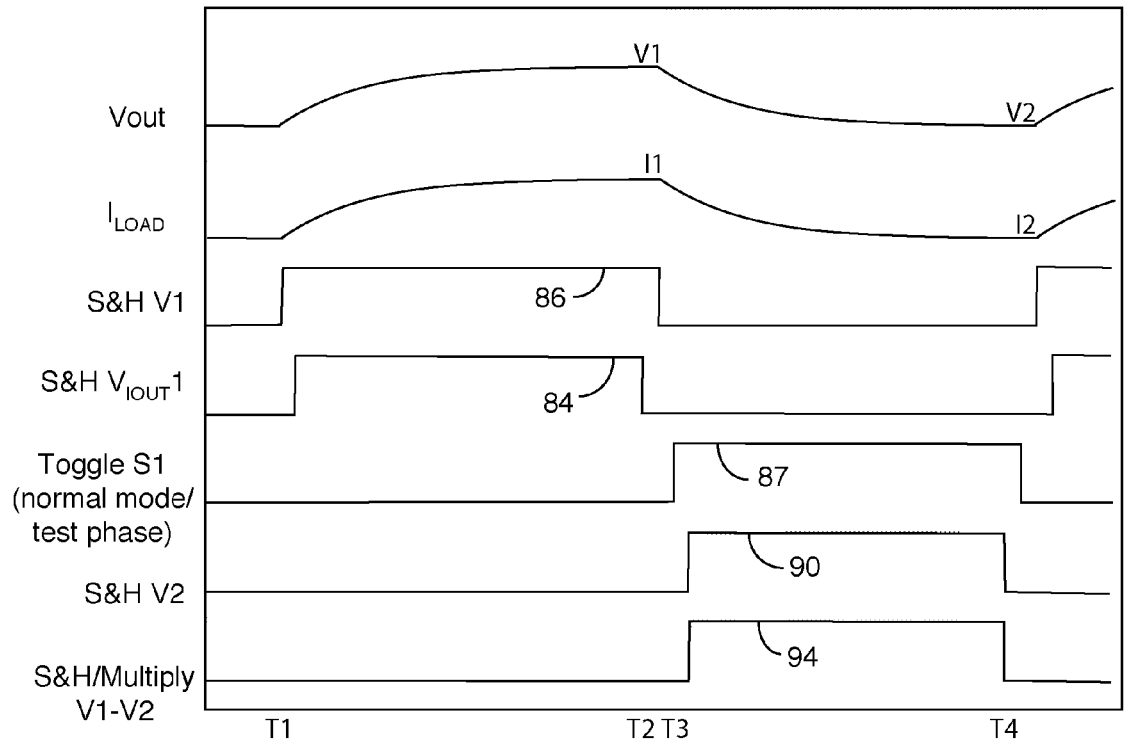
FIG. 6 illustrates various waveforms and control signals during the operation of the circuit of FIG. 5.

FIG. 5 illustrates another virtual remote sensing circuit that performs functions similar to those of the circuit of FIG. 2. However, the circuit of FIG. 5 only varies the regulator's output between two levels. FIG. 6 illustrates waveforms that occur in the circuit of FIG. 5.

At time T1 in FIG. 6, the normal mode has resumed after a test phase, and the regulator chip 20 ramps up its voltage and current to steady state values to supply a compensated regulated voltage V1 to the load 32 at a full load current. In this mode, the regulator is using the actual instantaneous output voltage in the feedback loop to generate an error voltage for regulation. At this time, the switch S1 connects the error amplifier 46 to the pin 22 of the regulator chip 20 so that the duty cycle is controlled to keep the inputs into the error amplifier 46 equal. A capacitor (not shown) is connected to pin 22 as in FIG. 2.

During the normal mode, a differential amplifier 80 amplifies the voltage difference across a low value sense resistor Rsense at a certain low gain (Gain1), where the gain level is set by the controller 48 (a state machine). The output of the amplifier 80 is a voltage ($V_{IOUT}1$) representing the load current during normal operation.

Sometime after the steady state current (I1) has been attained (at time T2), the controller 48 controls the sample & hold circuit 82, by control signal 84 (FIG. 6), to store the value $V_{IOUT}1$. $V_{IOUT}1 = Gain1 * I1 * Rsense$.

Also, sometime after the steady state voltage has been attained (at time T3), the controller 48 controls a sample & hold circuit 50, by control signal 86, to store the regulator voltage V1. $V1=V_{LOAD}+(I1*R_{LINE})$, where $V_{LOAD}$ is the voltage across the load 32 and $R_{LINE}$ is the total resistance along the lines 14 and 15.

The controller 48 then initiates the test phase by control signal 87 toggling switch S1 to connect pin 22 to the differential amplifier 88, and the controller 48 sets the gain of the differential amplifier 80 to a certain higher gain (Gain2). The differential amplifier 80 now generates a voltage $V_{IOUT}2$. The regulator chip 20 is thus controlled by the feedback loop to cause the inputs of the differential amplifier 88 to be the same ($V_{IOUT}1=V_{IOUT}2$). This occurs when a decreased output current I2 equals I1*(Gain1/Gain2). This lowering of the output current reduces the output voltage to V2, where $V2=V_{LOAD}+(I2*R_{LINE})=V_{LOAD}+[I1*(Gain1/Gain2)*R_{LINE}]$. Upon the output voltage V2 attaining a steady state (at time T4), the voltage V2 is then stored in the sample & hold circuit 52 by the control signal 90. The regulator is not outputting a regulated voltage at this time, but is outputting a voltage offset from the regulated voltage.

The subtractor 68 (a differential amplifier) then generates V1−V2, which is stored in the sample & hold circuit 92 at time T4 by control signal 94. V1−V2 is a fractional voltage drop (compared to the actual $V_{DROP}$ at the normal load current) due to the small change in output current during the test phase, so the sample & hold circuit 92 is designed to have a gain (Gain3) equal to $V_{DROP}/(V1-V2)=Gain2/(Gain2-Gain1)$ to fully compensate for the actual voltage drop ($V_{DROP}$) along the lines 14 and 15 at the full load current.

The $V_{DROP}$ value (output by the sample & hold circuit 92) and the reference voltage Vref1 are summed by the unity gain amplifier 75 to generate a compensated reference voltage Vref2. Vref2 and the regulator's output voltage are then applied to the inputs of the error amplifier 46.

The controller 48 then terminates the test phase by toggling switch S1 to connect pin 22 back to the output of the error amplifier 46. The regulator will now operate at a duty cycle to match the output voltage to Vref2, which compensates for the voltage drop along the lines 14 and 15.

Due to the smoothing by the load capacitor 42, the current through the load 32 is the average of the varying load current.

Figure 4:
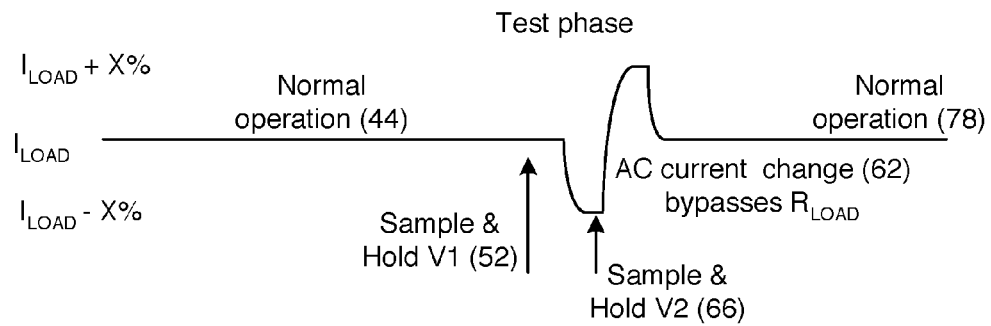
FIG. 4 is a waveform illustrating various steps in the flowchart of FIG. 3.

The circuit of FIG. 5 can easily be configured to output the three-level waveform of FIG. 4, and the circuit of FIG. 2 can easily be configured to output the two-level waveform of FIG. 6. Any of the other embodiments described herein can also be configured to output either the two or three level waveforms.

Figure 7:
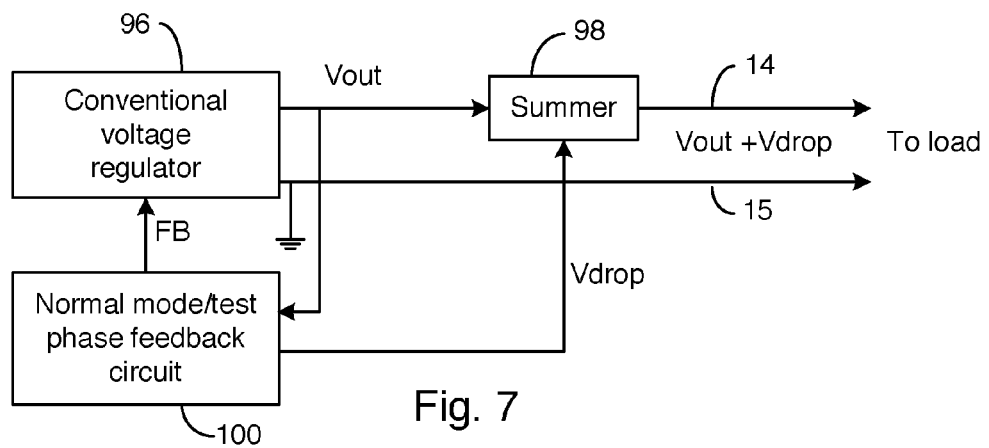
FIG. 7 illustrates another embodiment of the invention where the derived voltage drop is added to the conventional output of a regulator.
Figure 8:
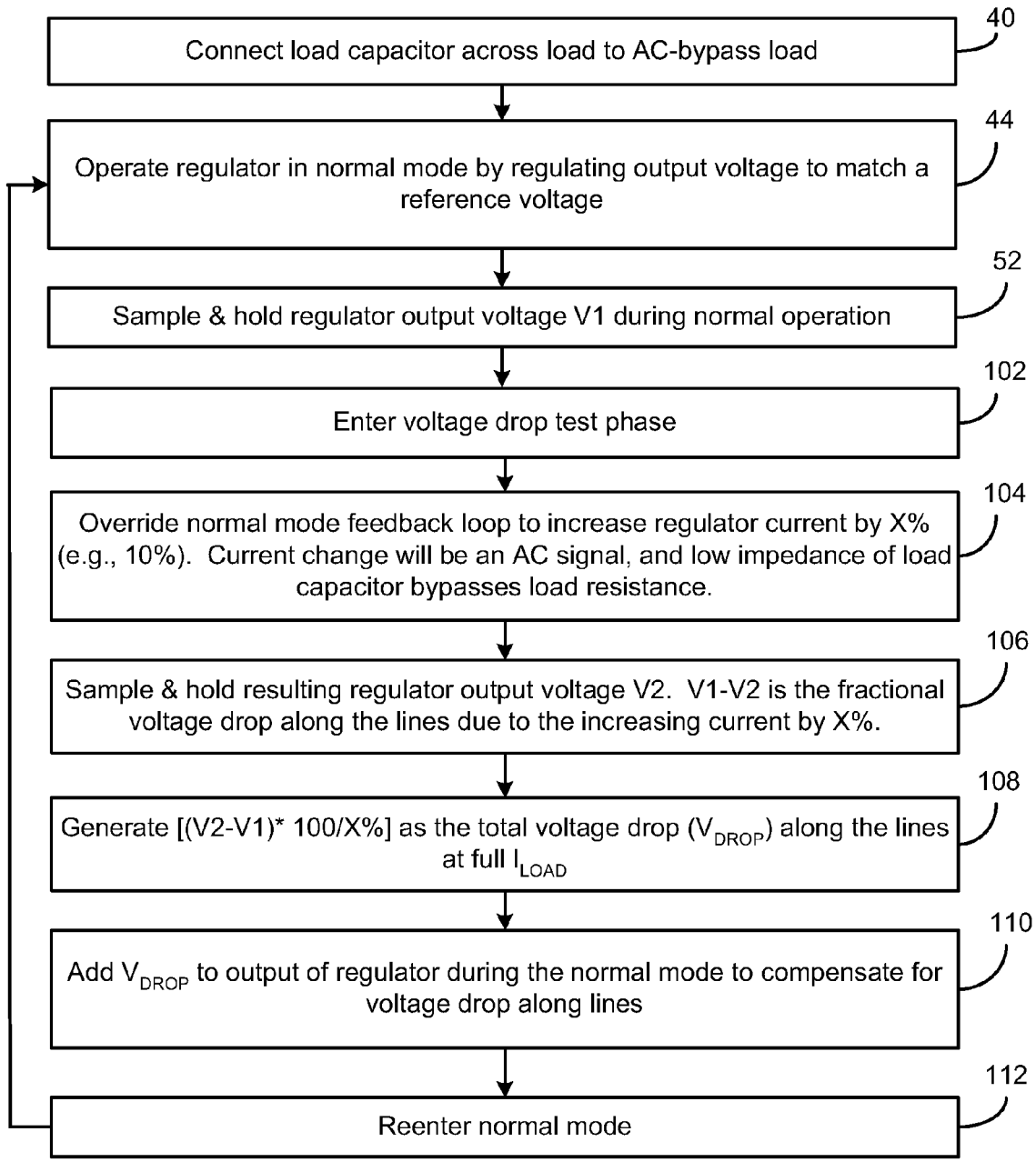
FIG. 8 is a flowchart of the operation of the circuit of FIG. 7.

In another embodiment of the invention, illustrated in FIG. 7, the $V_{DROP}$ value, derived using an intermittent test phase technique similar to that of FIG. 2 or 5, is added to the DC output of the conventional regulator 96 using a suitable summer 98. This technique is particularly suited for low voltage, low current applications. The normal mode/test phase feedback circuitry is represented by block 100 and may include the same circuitry in FIG. 2 or 5 that intermittently changes the regulator output current and voltage to derive the actual voltage drop. However, the output voltage of the regulator 96 is not compensated by a feedback signal, but is compensated by adding a $V_{DROP}$ voltage to its output. FIG. 8 is a flowchart of the operation of the circuit of FIG. 7.

In FIG. 8, steps 40, 44, and 52 are similar to the corresponding steps in FIG. 3, although different circuitry may be used. During the normal mode, the output voltage V1 is sampled and held.

The regulator enters the test phase in step 102. In step 104, the test phase feedback circuitry causes the regulator 96 to increase its output current by a fractional amount (X %), and the resulting output voltage V2 is sampled and held (step 106). The fractional voltage drop of V1−V2 is then generated and multiplied to derive the full voltage drop ($V_{DROP}$) along the lines 14 and 15 at the full load current (step 108).

The derived $V_{DROP}$ is then added to the output of the regulator to offset the voltage drop of the lines 14 and 15, and the normal mode is resumed (steps 110 and 112).

Figure 9:
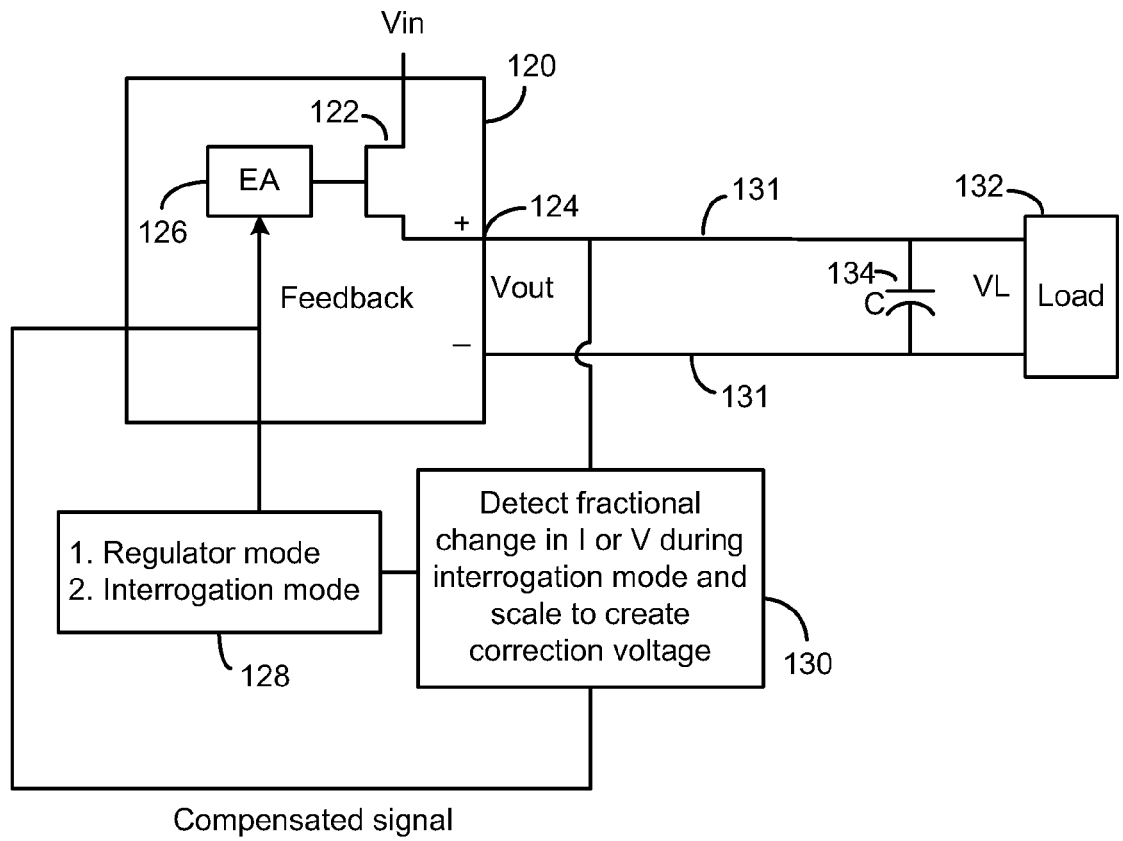
FIG. 9 illustrates a virtual remote sensing circuit and linear regulator, where the sensing circuit derives the line voltage drop by varying either current or voltage and then adjusts the regulator output to compensate for the line voltage drop.

FIG. 9 depicts the virtual remote sensing technique being applied to a linear regulator 120. A conventional linear regulator comprises a pass transistor, in this case a MOSFET 122, connected between an input voltage Vin and the output terminal 124. An error amplifier 126 is part of a feedback loop that detects a feedback voltage (conventionally the output voltage or a divided output voltage), compares the output to a reference voltage, and outputs a DC signal that controls the conductivity of the MOSFET 122 to cause the feedback voltage to substantially equal the reference voltage. The virtual remote sensing technique of the present invention is applied to the linear regulator in generally the same way as it is applied to a switching regulator, and many different circuits and algorithms can be used to implement the virtual remote sensing technique. Such circuits are represented by the functional blocks 128 and 130.

Assume a state machine or other controller initially causes the block 128 to place the regulator 120 in a normal regulator mode. The regulator 120 will then generate a current to create a Vout that matches a certain reference voltage.

At some time, the state machine triggers the interrogation mode of block 128, which sends a signal to the error amplifier 126, or uses another technique, to increase or decrease the regulator output current by a known fractional amount. Such a small variation is filtered by a load capacitor 134 at the load 132, and the load capacitor 134 acts as a low impedance to the AC signal. Block 130 detects the fractional change in the voltage (or current depending on the technique used) due to the line resistance and scales this fractional change to derive a signal related to the actual full voltage drop at the full load current. This correctional voltage signal is then applied to the linear regulator, such as by adjusting the reference voltage or the feedback voltage, to increase the current output of the regulator above what it would have been without the compensation to compensate for the line voltage drop.

Instead of the interrogation phase varying the current to the load, the voltage output of the regulator can instead be varied to detect a fractional change in current and thus derive the line resistance and a compensation signal.

Figure 10:
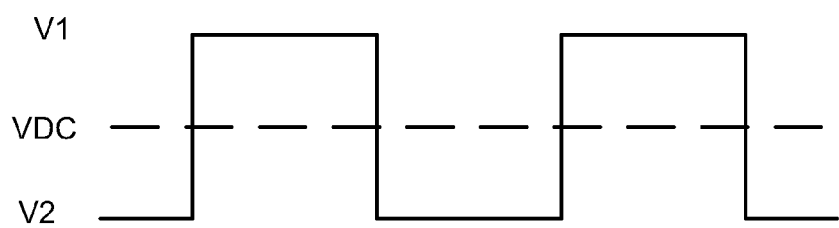
FIG. 10 illustrates a simplified dithered output voltage of the regulator of FIG. 9 or 11 and the resulting current.
Figure 10:
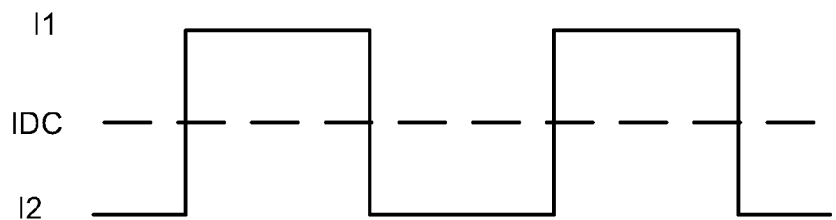

FIG. 10 illustrates simplified waveforms of the output of a regulator when the regulator is controlled to vary its output voltage between V1 and V2 (50% of time at each voltage). The average voltage output is VDC. As a result of this variation, the current at the output of the regulator will vary between I1 and I2, with the average current to the load being IDC. The load capacitor filters out the dither signal.

The following equations describe the compensated VDC at the output of the regulator needed to compensate for the voltage drop in the two lines leading to the load. VL is the voltage at the load that has been smoothed by the load capacitor. RLINE is the resistance of each line leading to the load.

$$VDC=VL+(2*RLINE*IDC) \qquad \text{(Eq. 1)}$$

Since the load capacitor appears as a short to the AC signal at the dither frequency, 2*RLINE can be determined from:

$$2*RLINE=(V1-V2)*(I1-I2) \qquad \text{(Eq. 2)}$$

For a 50% duty factor dither, the DC current is:

$$IDC=(I1+I2)/2 \qquad \text{(Eq. 3)}$$

So, by substitution, $$VDC = VL + [(V1-V2)*(I1+I2)]/2(I1-I2) \quad \text{(Eq. 4)}$$

Since achieving a certain specified voltage at the load (VL) is the goal, that value (e.g., 3 volts) would be used to initially set an uncompensated reference voltage or a feedback voltage divider, and the derived compensation signal would be added to the uncompensated reference voltage or subtracted from the feedback voltage to cause the regulator to output the necessary VDC to achieve the specified VL. The compensation voltage that needs to be added to the regulator's feedback loop is $[(V1-V2)*(I1+I2)]/2(I1-I2)$.

Effectively adding this compensation value can be done in many ways. One such way is shown in FIG. 11.

Figure 11:
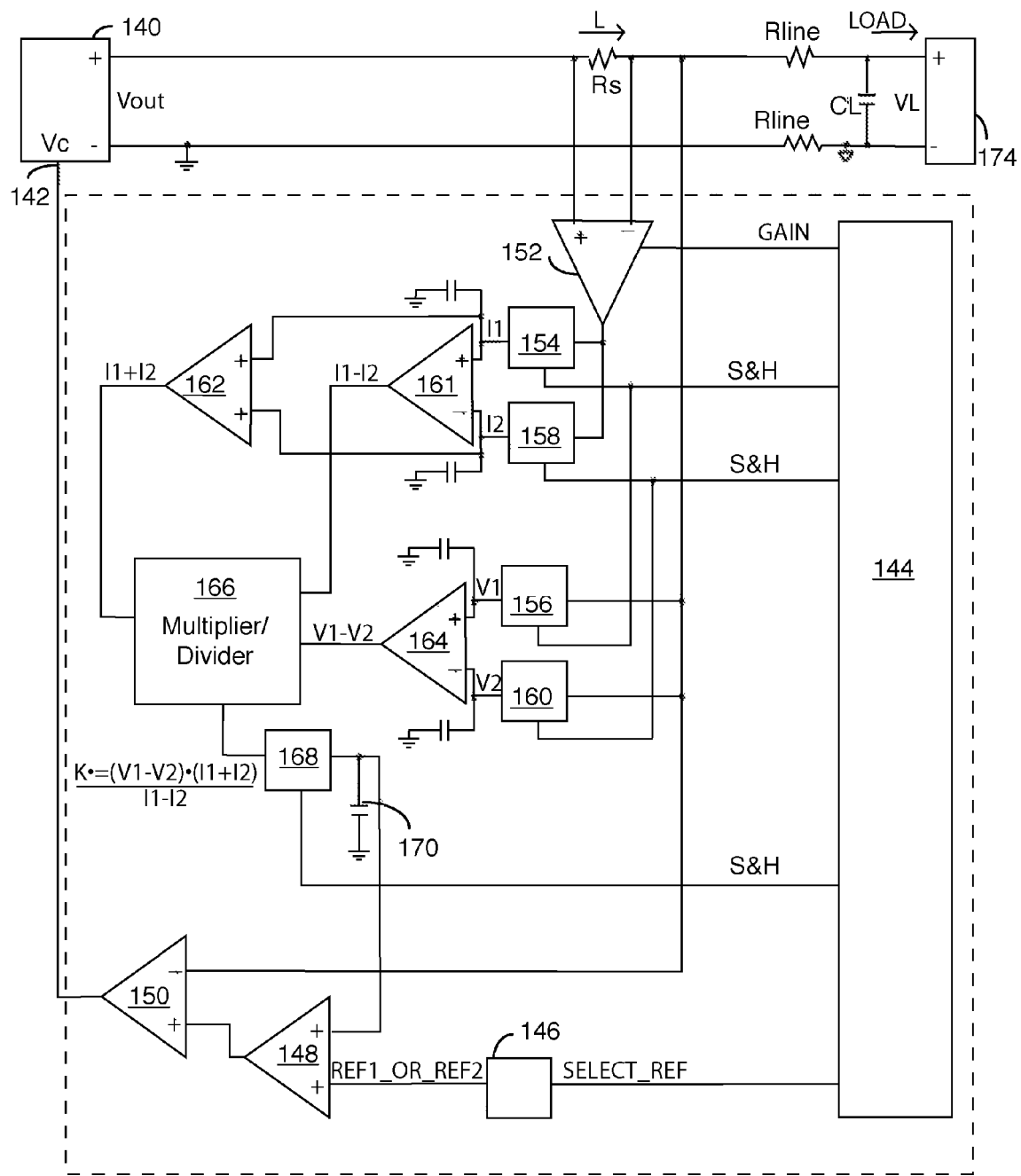
FIG. 11 illustrates a detailed circuit that dithers the output voltage of the regulator to derive the line voltage drop and then offsets the regulator feedback signal to compensate for the line voltage drop.

In FIG. 11, the regulator 140 may be a switching regulator, a linear regulator, or any other type of regulator that uses a feedback pin.

In the example of the circuit's operation, assume that the regulator 140 is receiving a feedback signal at its Vc pin 142 that causes it to output V1 in FIG. 10. The Vc pin is a standard pin that normally is the output of an internal error amplifier, and the voltage at the Vc pin is directly related to the duty cycle (for a switching regulator) or the pass transistor's conductivity (for a linear regulator). An integrating capacitor (not shown) is coupled to the Vc pin. The circuitry of FIG. 11 bypasses any internal feedback circuitry in the regulator 140.

Also in the example of the circuit's operation, assume that the feedback signal that causes the regulator to output V1 is due to the state machine 144 controlling the voltage reference 146 to apply the REF 1 to the summer 148. The instantaneous Vout near the output of the regulator 140 is applied to the input of the differential amplifier 150 (a transconductance amplifier) along with the output of the summer 148. The output of amplifier 150 may be connected to an integrating capacitor to create the feedback signal for the regulator 140. The regulator output voltage V1 results in the current I1 through the low value sense resistor Rs, and this Rs voltage drop is converted into a representative I1 signal by the differential amplifier 152. The state machine 144 controls a sample and hold circuit 154 to store this I1 signal. At the same time, the state machine 144 controls the sample and hold circuit 156 to store the output voltage V1.

The state machine 144 then controls the voltage reference 146 to switch the reference voltage to REF 2, which changes the Vc pin 142 signal to cause the regulator 140 to reduce the output voltage to V2 (FIG. 10) and the output current to I2. The state machine 144 then controls the sample and hold circuits 158 and 160 to hold the values I2 and V2, respectively.

The differential amplifier 161 outputs a value corresponding to I1-I2; the summer 162 outputs a value corresponding to I1+I2; and the differential amplifier 164 outputs a value corresponding to V1-V2. A multiplier/divider circuit 166 is configured to perform the equation $K*[(V1-V2)*(I1+I2)]/(I1-I2)$ (from equation 4 above) to derive a compensation voltage. The factor K is a multiplier for scaling the various values to take into consideration the various gains of the other circuitry, the 2 in the denominator of equation 4, and other factors, so that the output of the multiplier/divider circuit 164 is the actual compensation voltage.

The state machine 144 controls a sample and hold circuit 168 to hold this compensation voltage, and the capacitor 170 smoothes variations in this signal.

The derived compensation voltage is then added to the reference voltage (REF 1 or REF 2) by summer 148 to offset the reference voltage by the compensation voltage. The feedback network modifies the regulator duty cycle (if a switching regulator) or conductivity (if a linear regulator) to cause the voltages at the inputs of the differential amplifier 150 to be substantially equal. As a result, the output of the regulator 140 is effectively augmented by the compensation voltage equal to the voltage drops across the lines leading to the load 174.

The virtual remote sensing circuitry basically performs mathematical operations. As such, the circuitry for the virtual remote sensor can instead be a programmed digital signal processor (DSP) that carries out the algorithms described herein.

Figure 12:
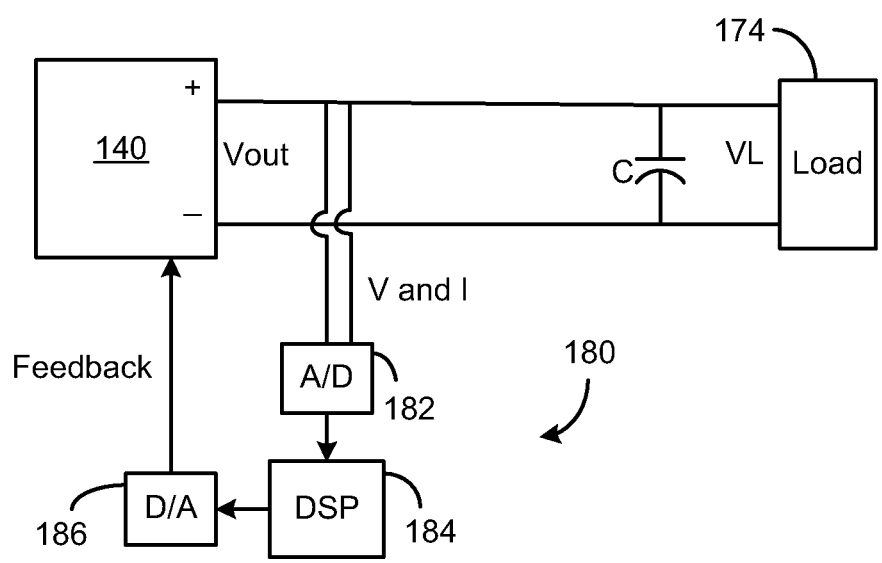
FIG. 12 illustrates the virtual remote sensing circuit as comprising a digital signal processor.

FIG. 12 shows a virtual remote sensing circuit 180. The output voltage and current of the regulator 140 are sensed by any means and converted into digital signals by an analog-to-digital converter 182. The DSP 184 then performs the various algorithms on the digital signal, as previously described, for generating a digital signal that periodically varies the regulator output for performing the line voltage drop/resistance interrogation, and then generates a compensation signal for the feedback loop to compensate for the line voltage drop. The digital output of the DSP 184 is then converted into a compensated analog feedback signal by a digital-to-analog converter 186 for controlling the regulator's 140 output voltage.

In embodiments using a conventional regulator chip, the virtual remote sense circuit bypasses the internal feedback circuit of the regulator chip. The inventive circuit can be connected to an external pin of the regulator chip (e.g., the Vc pin) or be connected to a suitable terminal of any regulator circuit. In one embodiment, the bypassed feedback circuitry in a regulator chip is disabled. Alternatively, a voltage feedback pin of a conventional regulator chip may be connected to a fixed signal so that the internal circuitry only generates a fixed signal that is offset by the inventive circuit. For example, by tying the Vfb pin of a conventional regulator controller chip to ground, the internal error amplifier in a typical regulator chip will output a fixed current at the Vc pin, and the output of the virtual remote sense circuit connected to the Vc pin can be an open-drain MOSFET connected between the Vc pin and ground. The MOSFET is controlled by the virtual sense circuit to siphon off the excess "error" current to cause the feedback voltage to match the compensated reference voltage, or to control the output of the regulator during the test phase.

In one embodiment, the regulator is custom designed to incorporate the inventive circuitry (as a single chip or formed of discrete components) so no circuitry needs to be bypassed. In one embodiment, the inventive circuit is in a separate chip that can be used with any type of regulator (e.g., voltage mode, current mode, step-up, step-down, etc.). In one embodiment, the inventive circuit is a separate IC incorporated in the same package as a regulator controller chip.

In some applications, it is desirable to isolate the feedback circuitry. Accordingly, any circuit described herein can be optically isolated from the lines and/or regulator by inserting a conventional optical isolator between the feedback circuit and the lines and/or between the feedback circuit and the regulator. The circuit can also be DC isolated from the regulator controller chip by connecting a transformer between the switching transistors and the load and connecting the feedback circuit downstream from the transformer.

If the frequency of dithering the regulator's output voltage or current may create undesirable harmonics or beat frequencies, or an existing ripple may interfere with the virtual remote sensing, the frequency of the interrogation mode can be varied within a range using conventional spread spectrum techniques. A beat frequency would be too low to be filtered out by the load capacitor, so such a spread spectrum technique may be important to ensure the load is not adversely affected by the virtual remote sense operation. One way to vary the interrogation frequency is to use a pseudo noise generator, which essentially randomizes the frequency within a defined range by controlling a delay circuit that initiates the interrogation mode.

Figure 13:
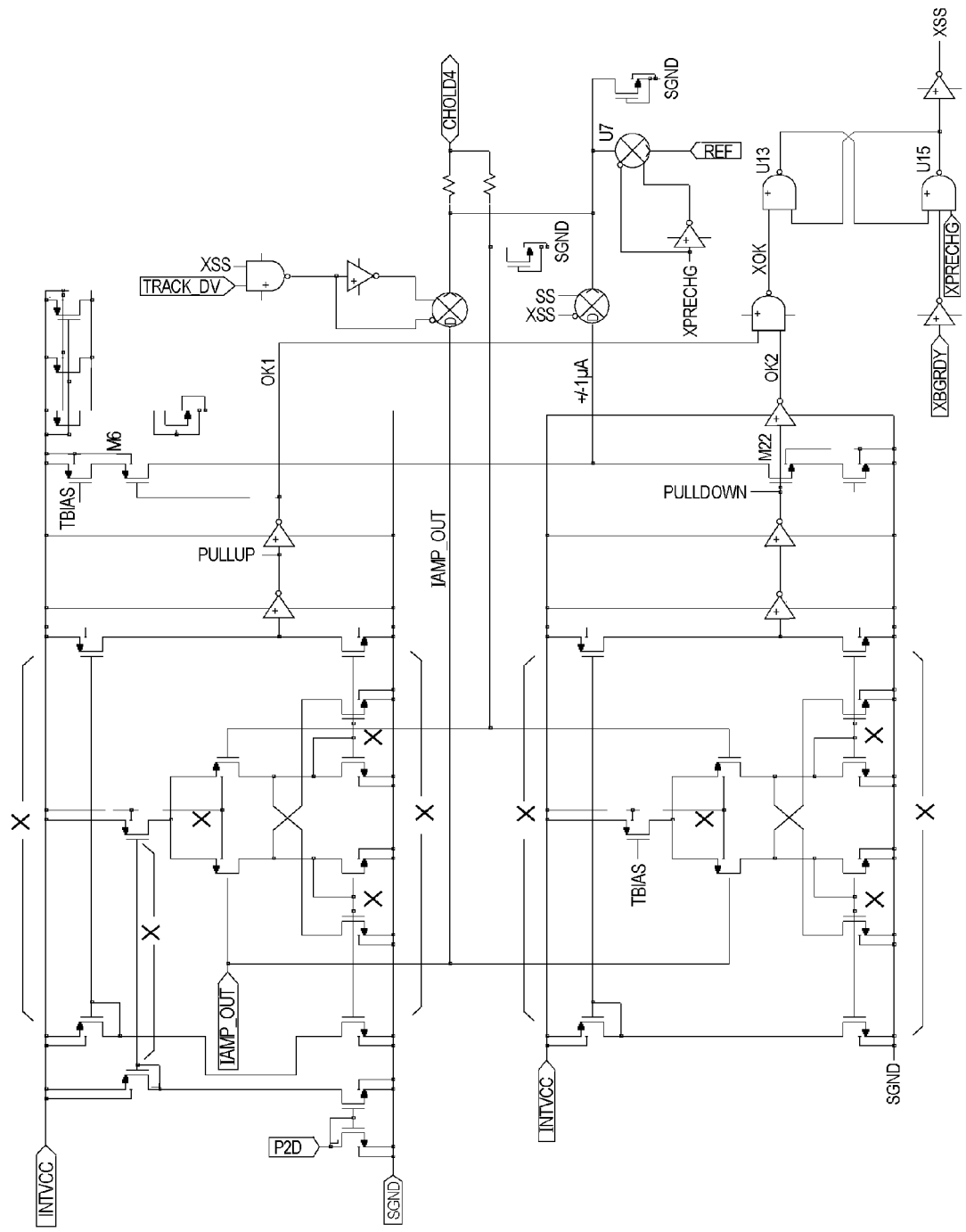
FIG. 13 illustrate one type of soft-start circuit that may be used to only apply the compensated signal to the feedback loop once the regulator has reached a steady state.

When the regulator is first turned on (powered up), the virtual sense circuit should not be adjusting the output voltage until the regulator is operating in the steady state and the output of the virtual sense circuit is correct. Accordingly, a soft-start circuit may be used to effectively delay the use of the derived compensation signal until a steady state condition. FIG. 13 illustrates a soft-start circuit that effectively blocks the compensation signal from affecting the operation of the regulator until a steady state condition has been reached. The compensation signal may, for example, be a correction to a reference voltage used by an error amplifier in the feedback path of the regulator.

In FIG. 13, the output of the soft-start circuit is labeled Chold4. Chold4 is connected to an external capacitor and the voltage on Chold4 is applied to an error amplifier in the feedback loop to set the regulator DC output voltage. A feedback voltage is applied to the other input of the error amplifier. In the steady state condition, Chold4 represents the compensated reference voltage previously described.

When power is first applied to the regulator circuit, XBGRDY (bandgap ready bar) is High and XPRECHG is Low, connecting a reference voltage on REF to Chold4 via a transmission gate U7 and resetting a flip flop formed by AND gates U13/U15. After the bandgap voltage reference stabilizes, XBGRDY goes Low. Shortly after that, a precharge phase ends (XPRECHG=High), disconnecting Chold4 from REF. Chold4 is now driven by a current source M6, controlled by a first hysteretic comparator output OK1, or by a current sink M22, controlled by a second hysteretic comparator output OK2. These two comparators compare IAMP_OUT (which corresponds to the compensated reference voltage required for full line voltage drop correction) to Chold4, and their outputs OK1 and OK2 control the slewing of Chold4 with a +/−1 uA current until Chold4 is within approximately +/−33 mV of IAMP_OUT (as determined by the hysteretic comparators). In other words, the correction is introduced slowly after start-up. When these conditions are met (OK1 and OK2 both high), soft correct ends and normal virtual remote sense operation begins. The ANDing of OK1 and OK2 causes the XOK signal to toggle the flip flop (comprising AND gates U13/U15), disconnecting the current sources from Chold4, and connecting IAMP_OUT to Chold4, forcing full line drop voltage correction.

Accordingly, an automatic voltage compensation circuit has been described using virtual remote sensing of a voltage drop along lines leading to a load. Various related techniques may be employed using the same sampling and fractional voltage drop concepts described herein, and such techniques are contemplated by the present invention.

The remote load may be any device, such as a laptop computer receiving power from a plug-in AC-to-DC adapter via long wires, a power over Ethernet system, a remote regulator receiving an input voltage from another power supply regulator, a battery receiving a charging current from a charger, or any other load.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for compensating a voltage regulator output for a voltage drop along one or more conductors conducting current between one or more output terminals of the regulator and a load comprising:
    operating the regulator in a first mode of operation to output, at the one or more output terminals of the regulator, a regulated first voltage at a first current drawn by the load;
    operating the regulator in a second mode of operation by temporarily changing the output of the regulator to cause the regulator to output a second voltage and second current;
    detecting a difference between at least the first voltage and the second voltage, or between the first current and the second current, to determine a first signal corresponding to a fractional voltage drop along the one or more conductors between the regulator and the load;
    computing, by using the first signal, a compensation voltage substantially corresponding to a full voltage drop along the one or more conductors when the regulator operates in the first mode of operation; and
    operating the regulator in the first mode while using the compensation voltage to compensate the output voltage of the regulator for the full voltage drop.

2. The method of claim 1 wherein a load capacitor is connected across the load, wherein the load capacitor appears as a low impedance to a changing output of the regulator to substantially bypass the load as the regulator changes between the first mode and the second mode, so that the difference between at least the first voltage and the second voltage, or between the first current and the second current, is primarily due to resistance in the one or more conductors between the regulator and the load.

3. The method of claim 1 wherein operating the regulator in the first mode while using the compensation voltage to compensate the output voltage of the regulator for the full voltage drop comprises compensating a feedback signal for the full voltage drop.

4. The method of claim 1 wherein operating the regulator in the first mode while using the compensation voltage to compensate the output voltage of the regulator for the full voltage drop comprises adding a voltage substantially equal to the full voltage drop to an output of the regulator.

5. The method of claim 1 wherein operating the regulator in the first mode while using the compensation voltage to compensate the output voltage of the regulator for the full voltage drop comprises inserting a voltage substantially corresponding to the full voltage drop into a feedback loop of the regulator.

6. The method of claim 5 wherein the voltage substantially corresponding to the full voltage drop compensates a reference voltage applied to an error amplifier in the feedback loop of the regulator, wherein a voltage corresponding to an output voltage of the regulator is applied to another input of the error amplifier.

7. The method of claim 1 wherein operating the regulator in the second mode of operation comprises controlling the regulator to change its output current by a predetermined amount, resulting in the second current being output at the second voltage.

8. The method of claim 1 wherein operating the regulator in the second mode of operation comprises controlling the regulator to change its output voltage by a predetermined amount, resulting in the second current being output at the second voltage.

9. The method of claim 1 wherein operating the regulator in the second mode of operation comprises controlling the regulator to change its output current by a predetermined amount, resulting in the second current being output at the second voltage, wherein controlling the regulator to change its output current comprises varying a gain of an amplifier measuring output current, wherein an output of the amplifier is used as a feedback signal in the second mode.

10. The method of claim 1 wherein operating the regulator in the second mode of operation comprises controlling the regulator to change its output voltage by a predetermined amount, resulting in the second current being output at the second voltage, wherein controlling the regulator to change its output voltage comprises changing a reference voltage applied to an error amplifier, where an output of the error amplifier controls an output of the regulator.

11. The method of claim 1 wherein the regulator is a switching regulator, and changing the output of the regulator comprises changing a duty cycle of the regulator.

12. The method of claim 1 wherein the regulator is a linear regulator, and changing the output of the regulator comprises changing a conductance of a pass transistor in the regulator.

13. The method of claim 1 wherein the regulator only alternates between the first mode and the second mode.

14. The method of claim 1 further comprising a third mode, wherein the regulator is controlled to temporarily change the output of the regulator to cause the regulator to output a third voltage and third current to offset the second current being generated during the second mode of operation.

15. The method of claim 1 wherein the step of operating the regulator in the second mode of operation occurs at varying frequencies.

16. The method of claim 1 further comprising performing a soft-start routine that only compensates the output voltage of the regulator after a certain period of time after start up of the regulator.

17. The method of claim 1 wherein the first mode of operation and the second mode of operation are controlled by a state machine.

18. The method of claim 1 wherein the step of computing the compensation voltage is performed by a digital signal processor.

19. A voltage regulator control circuit comprising:
a first terminal for receiving a first signal corresponding to an output voltage at one or more output terminals of a voltage regulator;
a second terminal for receiving a second signal corresponding to an output current of the voltage regulator;
a first circuit configured for detecting the first signal and second signal;
the first circuit also configured for controlling the voltage regulator to operate in a first mode of operation to output a regulated first voltage at a first current drawn by a load;
the first circuit also configured for operating the regulator in a second mode of operation by temporarily changing the output of the regulator to cause the regulator to output a second voltage and second current;
the first circuit also configured for detecting a difference between at least the first voltage and the second voltage, or between the first current and the second current, to determine a third signal corresponding to a fractional voltage drop along one or more conductors connected between the one or more output terminals of the regulator and the load;
the first circuit also configured for computing, using the third signal, a compensation voltage substantially corresponding to a full voltage drop along the one or more conductors connected to a load when the regulator operates in the first mode of operation; and
the first circuit also configured for operating the regulator in the first mode while using the compensation voltage to compensate the output voltage of the regulator for the full voltage drop.

20. The control circuit of claim 19 wherein a load capacitor is connected across the load, wherein the load capacitor appears as a low impedance to a changing output of the regulator to substantially bypass the load as the regulator changes between the first mode and the second mode, so that the difference between at least the first voltage and the second voltage, or between the first current and the second current, is primarily due to resistance in the one or more conductors between the regulator and the load.

21. The control circuit of claim 19 wherein the first circuit has an output connected to an input of a pulse-width modulator comparator for controlling a duty cycle of the voltage regulator.

22. The control circuit of claim 19 wherein the first circuit has an output connected to an error amplifier for controlling a conductivity of a pass transistor in a linear regulator.

23. The control circuit of claim 19 wherein the first circuit includes a second circuit that is configured to temporarily store a value corresponding to the first current and controls the regulator to change the output voltage until the second current is output from the regulator.

24. The control circuit of claim 19 wherein the first circuit includes a second circuit that is configured to temporarily store a value corresponding to the first voltage and controls the regulator to change the output voltage until the second voltage is output from the regulator.

25. The control circuit of claim 19 wherein the first circuit includes a scaler that scales up the fractional voltage drop to generate a signal corresponding to the full voltage drop.

26. The control circuit of claim 19 further comprising a state machine connected to the first circuit for controlling the first circuit to operate the regulator in the first mode and second mode.

27. The control circuit of claim 19 wherein the first circuit is a programmed digital signal processor.

28. The control circuit of claim 19 wherein the first circuit includes an error amplifier, the compensation voltage offsetting a reference voltage or feedback voltage into the error amplifier to generate a compensated control signal to compensate the output voltage of the regulator for the full voltage drop.

29. The control circuit of claim 19 wherein the first circuit has an output connected to a Vc terminal of the voltage regulator.

30. The control circuit of claim 19 further comprising a soft-start circuit that prevents the compensation voltage from compensating the output voltage of the regulator until certain conditions have been met after start-up of the regulator.

31. The control circuit of claim 19 wherein the first circuit is also configured to initiate the second mode at a variety of frequencies.

32. The control circuit of claim 19 wherein the first circuit is configured to control the regulator so that the regulator only alternates between the first mode and the second mode.

33. The control circuit of claim 19 wherein the first circuit is also configured to operate the regulator in a third mode to temporarily change the output of the regulator to cause the regulator to output a third voltage and third current to offset the second current being applied to the load during the second mode of operation.

34. A circuit for compensating for voltage drops in one or more lines between one or more output terminals of a voltage regulator and a load comprising:
- a voltage regulator configured to output an output voltage at the one or more output terminals;
- a modulator circuit, connected to the voltage regulator, configured to periodically modulate an output of the voltage regulator;
- a detector circuit configured to detect a current or voltage change at the output of the voltage regulator as a result of the modulation due to at least a resistance of the one or more lines; and
- a compensation circuit, connected to the detector circuit and the voltage regulator, configured to scale up a detected change to generate a compensation signal, and to apply the compensation signal to the voltage regulator to compensate the output voltage for voltage drops in the one or more lines.

* * * * *